United States Patent [19]

van der Werf

[11] Patent Number: 5,026,166
[45] Date of Patent: Jun. 25, 1991

[54] APPARATUS FOR PRE-ALIGNING SUBSTRATE PREPARATORY TO FINE ALIGNMENT

[75] Inventor: Jan E. van der Werf, Eindhoven, Netherlands

[73] Assignee: U.S. Philips Corporation, New York, N.Y.

[21] Appl. No.: 656,218

[22] Filed: Oct. 1, 1984

[30] Foreign Application Priority Data

May 29, 1984 [NL] Netherlands ............... 8401710

[51] Int. Cl.$^5$ .............................................. G01B 11/00
[52] U.S. Cl. .................................................. 356/401
[58] Field of Search .............................. 356/400, 401

[56] References Cited

U.S. PATENT DOCUMENTS

| | | | |
|---|---|---|---|
| 4,037,969 | 7/1977 | Feldman et al. | 356/400 |
| 4,062,623 | 12/1977 | Suzuki et al. | 356/401 |
| 4,251,129 | 2/1981 | Suzuki et al. | 356/401 |
| 4,573,791 | 3/1986 | Phillips | 356/401 |

FOREIGN PATENT DOCUMENTS 0133428 8/1982 Japan ................................ 356/401

OTHER PUBLICATIONS

"Automatic Alignment System for Optical Projection Printing" Bouwhuis et al. *IEEE Trans. on Electron Devices* vol. ED-26 #4 4/1979.

Primary Examiner—Richard A. Rosenberger

[57] ABSTRACT

A pre-alignment system for use in an apparatus including a fine alignment system. The pre-alignment system includes two optical imaging systems for imaging two alignment marks provided on a substrate for the purpose of fine alignment onto two radiation-sensitive detectors. The outputs signals of the detectors are indicative of the pre-alignments of a associated substrate mark relative to the associated detection systems.

9 Claims, 2 Drawing Sheets

APPARATUS FOR PRE-ALIGNING SUBSTRATE PREPARATORY TO FINE ALIGNMENT

The invention relates to an apparatus for imaging a mask pattern on a substrate, which apparatus comprises a projection column provided with an optical imaging system and an optical fine-alignment system for aligning alignment marks on the substrate relative to an alignment mark in the mask, which apparatus further comprises a pre-alignment station for pre-aligning the substrate, and transfer means for transferring the substrate to a position beneath the projection column without disturbing the pre-alignment.

Such an apparatus, which is employed for the repeated projection of a reduced-scale image of an IC pattern on a semiconductor substrate, is described inter alia in the article "Automatic Alignment System for Optical Projection Printing", in "IEEE Transactions on Electron Devices", Vol. ED-26, No. 4, April 1979, pages 723–728. The fine-alignment system of this apparatus enables a substrate to be aligned relative to the mask with an accuracy of the order of 0.1 $\mu$m. Fine-alignment is effected fully automatically and comparatively rapidly, within 1 to 2 seconds, so that a large number of substrate wafers can be passed through the imaging apparatus and exposed in a short time. The alignment range of the fine-alignment system is relatively small, for example ±40 $\mu$m, so that pre-alignment of the substrate is necessary. In order to ensure that this pre-alignment does not lead to a reduction of the speed with which the substrate wafers are fed through the imaging apparatus, the apparatus comprises a pre-alignment station next to the projection column. During fine-alignment and exposure of a first substrate wafer in the projection column the next substrate wafer can be pre-aligned in the pre-alignment station, so that in principle two steps are carried out at the same time.

Pre-alignment can be effected by means of a microscope by means of which it is ascertained whether a substrate wafer is positioned correctly relative to a fixed reference, such as cross-hairs, in the apparatus. Depending on the positional error thus found the wafer position is corrected manually. This non-automatic pre-alignment demands a comparatively long time and requires much skill from the operator.

Automatic pre-alignment is possible if the substrate table has been provided with stops against which the substrate wafer must be positioned. The problem may be encountered that the edge of the substrate wafer is not always well-defined, so that the required pre-alignment accuracy cannot be attained, which results in incorrect alignment of the substrate wafer by the fine-alignment system.

The present invention aims at providing an imaging apparatus in which pre-alignment is effected automatically and very accurately. To this end the apparatus in accordance with the invention is characterized in that the pre-alignment station comprises two optical systems for imaging the two alignment marks on the substrate onto two composite radiation-sensitive detector, the combined output signals of the subdetectors of each detector being a measure of the alignment of the corresponding alignment mark relative to the detector.

The invention is based on the recognition of the fact that the alignment marks intended for fine-alignment inside the projection column are also very suitable for the purpose of pre-alignment outside the projection column, As two alignment marks and two composite detectors are used, it is not only possible to pre-align the marks themselves in two mutually perpendicular directions, but it is also possible to establish the orientation of a connecting line between the centres of the alignment marks, i.e. to effect an angular alignment.

It is to be noted that it is known per se, inter alia from German patent application No. 3,235,247, to employ the same alignment marks for fine-alignment and for pre-alignment. However, in the apparatus in accordance with German patent application No. 3,235,247 pre-alignment is also effected in the projection column and not in a separate pre-alignment station. Further, said apparatus employs the same optical systems for fine-alignment and pre-alignment; only the processing of the detector signals for the two types of alignment differs.

As described in the above-mentioned article in "IEEE Transactions on Electron Devices", Vol. ED-26, no. 4, April 1979, pages 723–728, it is very advantageous to employ phase gratings as alignment marks, i.e. gratings which only influence the phase of a light beam which is incident upon them, for the alignment of a substrate relative to a mask. An apparatus which is suitable for exposing a substrate with phase gratings is characterized in that the two imaging systems in the pre-alignment station are constituted by microscopes which image the phase gratings on the detectors as amplitude structures.

These microscopes, may be phase-contrast microscopes which have been described comprehensively in the literature and in which radiation which has not been diffracted by the phase object passes through a quarter-wave plate. This radiation interferes with the radiation which has been diffracted by the object, so that an image is formed whose brightness variations represent the phase variations in the object. The radiation used must be highly coherent. It is then possible to utilize only a small part of the radiation emitted by a non-coherent radiation source, such as an incandescent lamp; however, the amount of radiation on the phase grating and hence on the detector is then samll. As an alternative, a laser may be used for the radiation source. Apart from being coherent the radiation emitted by a laser is also monochromatic. In an apparatus for imaging a mask pattern on a substrate the use of monochromatic radiation, however, may present problems because in the consecutive process steps in the fabrication of an integrated circuit each time a thin layer of a material is deposited onto the substrate. A plurality of such thin layers may act as an anti-reflection coating for the laser radiation used. Then the detector will receive only a small amount of radiation.

A preferred embodiment of the invention in which the radiation of the pre-alignment beam covers a comparatively wide wavelength range is characterized in that the microscopes are interference microscopes which each comprise an illumination system, an imaging lens for the formation of a radiation spot on a phase grating and for imaging this grating onto a detector and a beam-splitting element for splitting the radiation from the illumination system into two subbeams in such a way that at the location of the phase grating the sub-beams are shifted relative to each other over a distance equal to half the grating period of the phase grating and for combining the two sub-beams which have been reflected by the phase grating.

Since the two recombined sub-beams interfere with each other the phase structure of the grating is converted into an amplitude structure. The phase grating is imaged as a bright spot on the detector, the variation of the intensity distribution over the detector being determined by the position of the phase grating, i.e. of the substrate, relative to the detector.

Preferably, the apparatus in accordance with the invention is characterized further in that the beam-splitting element is a polarization-sensitive beam splitter and a polarization-sensitive beam reflector is arranged between the illumination system and the imaging lens for directing radiation of a specific direction of polarization towards the phase grating and for transmitting the radiation which has been reflected by the phase grating to the detector.

The polarization-sensitive beam splitter may comprise a Savart plate or a Wollaston prism.

In accordance with a further characteristic feature of the invention the beam reflector comprises a polarization, sensitive beam-splitting layer which comprises two sub-layers which operate in two adjacent wavelength ranges. The composite beam-splitting layer operate over a relatively wide wavelength range.

In order to ensure that as much as possible light from the radiation source and a minimum amount of stray light reaches the phase grating and in order to suppress noise in the detector signal the apparatus in accordance with the invention may be characterized further in that the illumination system comprises a radiation source followed by a condenser lens which images the radiation source in the pupil of the imaging lens and a field aperture arranged behind the condenser lens, which aperture is imaged on the phase grating.

The apparatus in accordance with the invention may be characterized further in that before the detector a beam separator having a low reflection coefficient is arranged in order to reflect a small portion of the radiation which has been reflected by the phase grating to a reference marks, and there are provided optical means for visually observing the reference mark and the images of the two phase gratings superimposed on said mark.

The invention will now be described in more detail, by way of example, with reference to the drawings, in which:

FIG. 1 shows an apparatus for the repeated imaging of a mask pattern on a substrate. The principal parts of this apparatus are a projection column in which a pattern C to be imaged is mounted and a movable substrate table WT by means of which the substrate can be positioned relative to the mask pettern.

The projection column accommodates an illumination system which may comprise a lamp LA, for example a mercury lamp, an elliptical mirror EM, an element IN which is referred to as an integrator, which ensures a homogeneous radiation distribution within the projection beam b, and a condenser lens CO. The beam b illuminates a mask pattern C arranged on a mask table MT. A second mask pattern T may be arranged on the mask table MT. By rotating the table MT about the spindle MA the second mask pattern can be transferred into the projection column.

The beam which traverses the mask pattern C passes through a schematically shown projection-lens system PL in the projection column, which system forms an image of the mask pattern C on the substrate W. The projection lens system, which has, for example a 5:1 reduction, a numerical aperture 0.3, and a diffraction-limited image field of a diameter of 14 mm may comprose a collimator and an objective. The collimator images the mask pattern at infinity and the objective images this pattern in its focal plane. The objective is movable in a vertical direction to follow height variations in the substrate.

The substrate W is arranged on an air-bearing supported substrate table WT. The projection lens system PL and the substrate table WT are mounted in a housing HO which at its bottom is closed by a, for example granite, bed plate BP and at its top by the mask table MT. The apparatus further comprises a substrate changer WC which is rotatable about a spindle WCA and which is also adjustable in height. By means of this changer a substrate can be transferred from a pre-alignment station CA into the projection column. For further details on the construction and operation of the projection device reference is made to the article "Automatic Alignment System for Optical Projection Printing" in "IEEE Transcation on Election Devices", Vol. ED-26, no. 4, April 1979, pages 723–728.

Figure 1:
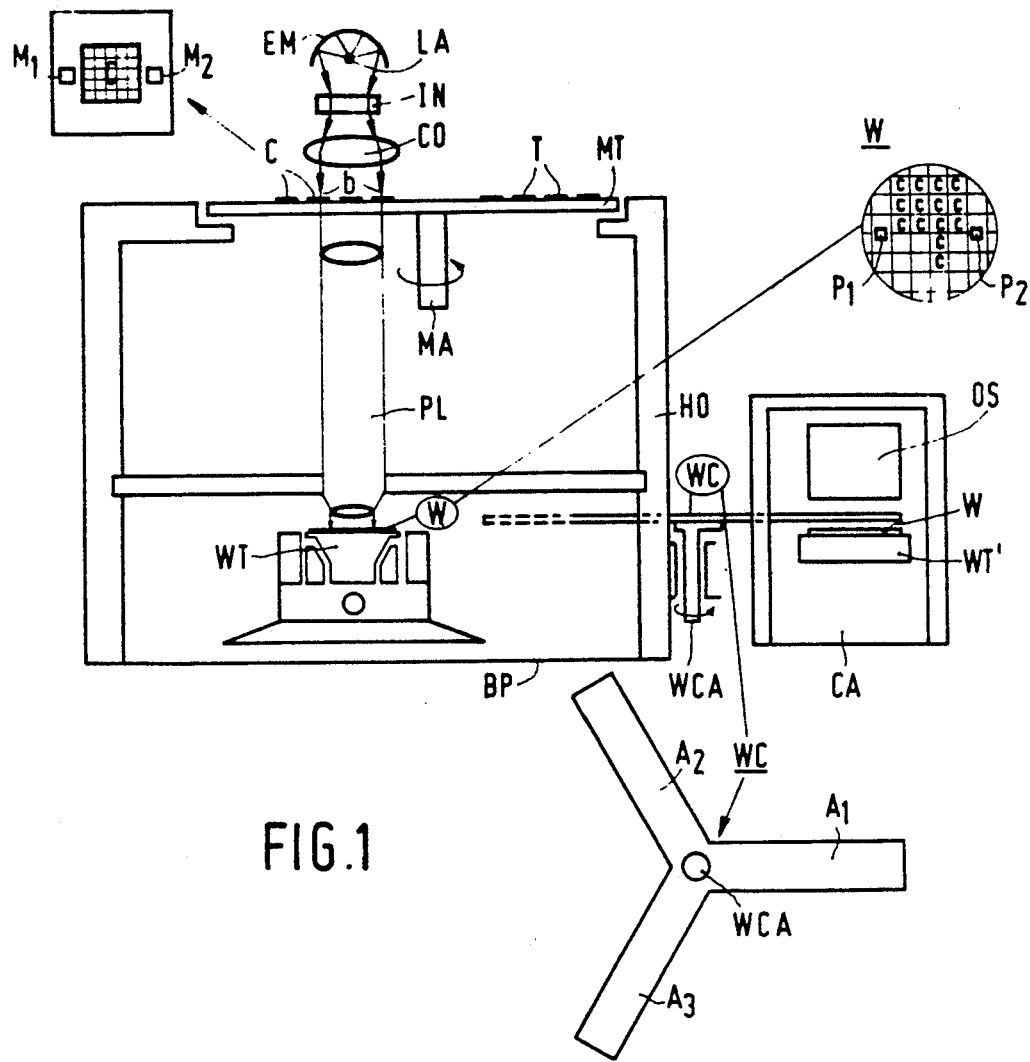
FIG. 1 shows an apparatus for imaging a mask pattern on a substrate, which apparatus is equipped with a pre-alignment station.

This article describes the method of fine-alignment of the substrate relative to the mask. For this purpose use is made of two phase gratings in the substrate and a grating in the mask. The left-hand part of FIG. 1 shows the mask pattern C and the associated grating marks $M_1$ and $M_2$ and the right-hand part of this Figure shows the substrate W and the substrate grating marks $P_1$ and $P_2$. It also shows the repeated reduced image of the mask pattern C on the substrate.

Figure 2:
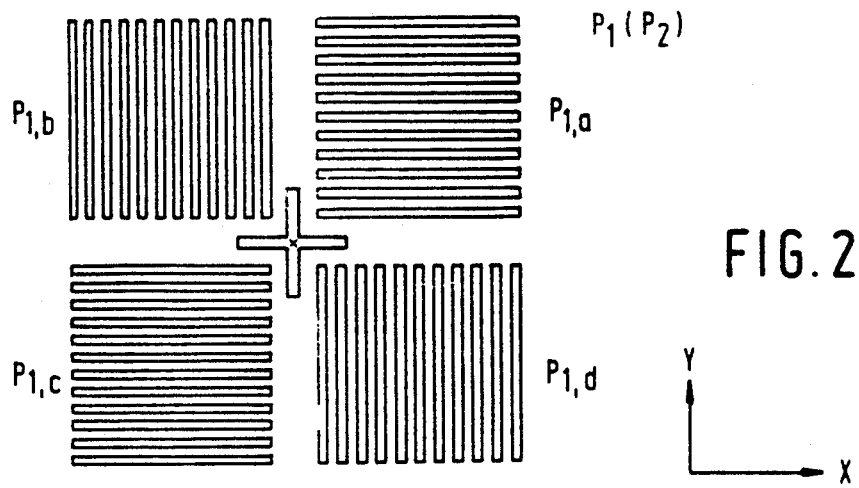
FIG. 2 shows a substrate grating-mark for fine-alignment.

FIG. 2 shows one of the two identical substrate phase gratings on an enlarged scale. Such a grating may comprise four sub-gratings $P_{1,a}$, $P_{1,b}$, $P_{1,c}$ and $P_{1,d}$ of which $P_{1,b}$ and $P_{1,d}$ serve for alignment in the X-direction and $P_{1,a}$ and $P_{1,c}$ for alignment in the Y-direction. The two sub-gratings $P_{1,b}$ and $P_{1,c}$ may have a grating period of, for example, 16 $\mu$m and the sub-gratings $P_{1,a}$ and $P_{1,d}$ may have a period of, for example, 17.6 $\mu$m. Each of the sub-gratings may measure, for example, $200 \times 200$ $\mu$m.

As described in the above-mentioned article in "IEEE Transactions of Electron Devices", Vol. ED-26, no. 4, pages 723–728, it is possible to attain an alignment accuracy of approximately 0.1 $\mu$m by imaging the grating marks $P_1$ and $P_2$ on the corresponding grating mark $M_2$ in the mask by means of a suitable optical system. However, the alignment rnage of this very accurate fine-alignment system is only $\pm 40$ $\mu$m, which necessitates pre-alignment. This pre-alignment is effected in a pre-alignment station referenced CA in FIG. 1. After the substrate has been pre-aligned the substrate changer, which performs a very accurately defined movement and which has been provided with mechanical means for accurately retaining the substrate during transfer, can pick up the substrate, transfer it to the substrate table in the projection column, and lower it onto the substrate table without disturbing the obtained pre-alignment.

As is shown schematically in FIG. 1 the pre-alignment station comprises a substrate table WT' by means of which the substrate can be positioned and an optical system OS for determining the position of the substrate relative to a fixed reference in the pre-alignment station.

The substrate changer WC may comprise a three-limb member which is rotatable about a spindle WCA. The lower part of FIG. 1 shows this substrate changer in plane view. The limbs $A_1$, $A_2$ and $A_3$ are provided with retaining means, not shown; the end portions of the limbs may be provided with, for example, a vacuum connection to retain the substrate on the lower surface during transfer. The substrate changer is so constructed that if the end of the limb $A_1$ is situated above the substrate table WT' in the pre-alignment station the end of the limb $A_2$ is situated above the substrate table WT beneath the projection column and the end of the limb $A_3$ projects from the projection column. In this position the limb $A_1$ can receive a pre-aligned substrate to transfer it to a position underneath the projection column, the limb $A_2$ can receive an exposed substrate to move it outside the apparatus, and the limb $A_3$ can transfer a substrate to further transport means. A substrate table may comprise a supporting member which is vertically adjustable over a distance which is larger than the thickness of the limbs of the substrate changer. This supporting member may comprise tubular supporting elements. In the position in which a substrate is situated above the substrate table WT the supporting elements support this substrate. The limb then releases the substrate, for example by turning off the vacuum in the vacuum connection of this limb, and the arm is pivoted away. The supporting member is then moved downwards until the supporting surface is situated at the same level as the upper surface is situated at the same level as the upper surface of the substrate table. Such a substrate table and substrate changer are described in U.S. Pat. No. 4,522,489 based on the previous Netherlands patent application No. 8300220.

Figure 3:
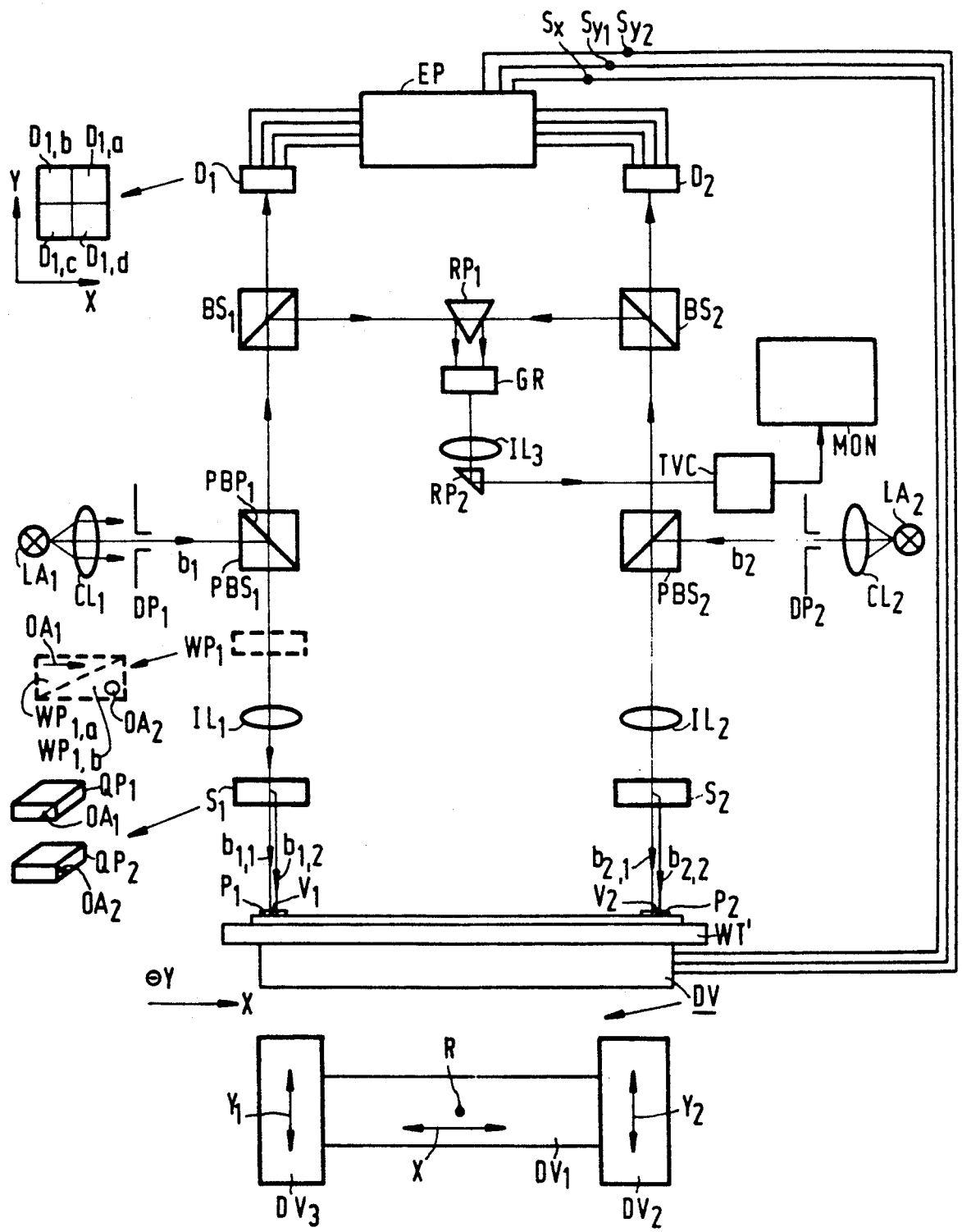
FIG. 3 shows an optical-pre-alignment station in accordance with the invention.

FIG. 3 shows an optical pre-alignment system to be used in the pre-alignment station. This system comprises a first imaging system for imaging the substrate mark $P_1$ on a first radiation-sensitive detector $D_1$ and an identical second imaging system for imaging the substrate mark $P_2$ on the radiation-sensitive detector $D_2$. The first imaging system comprises an imaging lens $IL_1$ for the formation of a radiation spot $V_1$ on the mark $P_1$ and for imaging this radiation spot on the detector $D_1$. Imaging must be effected in such a way that the phase structure of the grating is converted into an amplitude structure or intensity distribution.

According to the invention the alignment beam $b_1$ is therefore split into two sub-beams $b_{1,1}$ and $b_{1,2}$ which are shifted over a distance equal to half a grating period at the location of the phase grating $P_1$, which sub-beams further have such a phase difference that after they have been reflected from the substrate and have been made to interfere the grating is imaged as a bright radiation spot on the detector and the area surrounding the grating in the image is dark.

For this purpose a birefringent element, for example a Savart plate, has been arranged in the path of the pre-alignment beam $b_1$. This plate is shown in perspective in the left-hand part of FIG. 3. The Savart plate comprises two equally thick plane-parallel plates $QP_1$ and $QP_2$ of uniaxial birefringent crystals whose optic axes $OA_1$ and $OA_2$ make angles of 45° with the plane-parallel surfaces, the plates being rotated through 90° relative to each other. A radiation beam with a direction of polarization which is oriented at an angle of 45° relative to the optic axes of the Savart plate and which is perpendicularly incident upon the plane-parallel surfaces is split into an ordinary beam and an extraordinary beam in the first plate $QP_1$, which beams are transformed into an extraordinary beam and an ordinary beam, respectively at the interface between the first and the second quartz plate. This is because the optic axes of the plates $QP_1$ and $QP_2$ extend perpendicularly to each other. Two mutually parallel beams $b_{1,1}$ and $b_{1,2}$ issue from the Savart plate $S_1$, which beams have mutually perpendicular directions of polarization and which are shifted relative to each other over a distance which is a function of the thickness of the plates and the refractive indices. By a suitable choice of these parameters it is possible to ensure that the sub-beams are shifted relative to each other over a distance which is equal to half the period of the phase grating $P_1$.

Further, a polarization-sensitive beam reflector $PBS_1$ is arranged in the path of the pre-alignment beam $b_1$. The selective-reflecting surface $PBP_1$ of this prism functions as a polarization analyzer which only reflects radiation with a specific direction of polarization, namely at an angle of 45° to the optic axes of the Savart plate, to this plate $S_1$. After the two sub-beams $b_{1,1}$ and $b_{1,2}$ have been reflected by the substrate and have traversed the Savart plate a second time, they are again incident on the prism $PBS_1$. The two mutually perpendicular directions of polarization of the two sub-beams make an angle of 45° with the transmitting direction of polarization of the selective reflective surface $PBP_1$. Each of these sub-beams may be thought of as comprising two components of which the first and the second have a direction of polarization which extend parallel and perpendicularly, respectively to the direction of polarization of the prism $PBS_1$. This detector "sees" one beam with one direction of polarization in which no components can be distinguished.

The phase difference between the sub-beams which emerge from the Savart plate $S_1$ depends on the refractive index $n_o$ for the ordinary ray and $n_e$ for the extraordinary ray and the thicknesses of the plates $QP_1$ and $QP_2$ and the tilting of the Savart plate about an axis which extends transversely of the beam $b_1$ and perpendicularly to the plane of drawing. It is ensured that the sub-beams $b_{1,1}$ and $b_{1,2}$ are in phase. Corresponding portions of the sub-beams which have been reflected by substrate parts outside the phase grating are then also in phase. The beam which is formed through the combination by the Savart plate of the beam components which have been reflected by the substrate areas outside the phase grating then has the same direction of polarization as the beam which is incident on the substrate and the first-mentioned beam is not transmitted to the detector by the polarization-sensitive reflector $PBS_1$.

The effect of the grating is best explained if the sub-beams $b_{1,1}$ and $b_{1,2}$ are assumed to consist of small beam portions of the size of "hills" and "dales" of the plate grating. If a first beam portion of the beam $b_{1,1}$ is incident on a hill, the corresponding first beam portion of the beam $b_{1,2}$ will impinge on a dale of the plate grating. As a result of the grating structure the first beam portion of the beam $b_{1,1}$ is retarded relative to the first beam portion of the beam $b_{1,2}$, which retardation is a function of the depth of the grating dales or grooves. In order to obtain an optimum fine-alignment signal the grating grovves have been given a depth of one quarter wave. This depth is also substantially optimal for the pre-alignment system. Said retardation is then 180°. Similary, a second beam portion of the beam $b_{1,1}$ which impinges on a dale of the phase grating and a corresponding beam portion of the beam $b_{1,2}$ which is incident on a hill will exhibit a phase difference of 180° after reflection and after passage through the prism $PBS_1$. This applies to all the corresponding beam portions originating from the phase grating. In total the sub-beams $b_{1,1}$ and $b_{1,2}$, if they originate from the phase grating, are 180° phase-shifted relative to each other. In terms of directions of polarization this means that the direction of polarization of one of the sub-beams has been shifted through 180° relative to the original direction of polarization, so that the direction of polarization of the beam which is composed of the two reflected sub-beams has been rotated through 90° relative to the direction of polarization of the beam $b_1$ which has been reflected by the prism $PBS_1$. The part of the beam $b_1$ which has been reflected by the phase grating is transmitted to the detector $D_1$ by the beam splitter, so that this detector "sees" the phase grating as a bright surface against a black background.

As is shown in the inset in FIG. 3 the detector comprises four subdetector $D_{1a}$, $D_{1b}$, $D_{1c}$ and $D_{1d}$. The output signals of these detectors are proportional to the amount of radiation received by these detectors. When these output signals are exactly equal, the grating $P_1$ is aligned correctly in the system. If the output signals of the detectors $D_{1,a}$, $D_{1,b}$, $D_{1,c}$ and $D_{1,d}$ are represented by $S_a$, $S_b$, $S_c$ and $S_d$ the signal $S_x=(S_a+S_d)-(S_b+S_c)$ will be a measure of the alignment in the X-direction and the signal $S_y=(S_a+S_b)-(S_c+S_d)$ will be a measure of the alignment in the Y-direction. The output signals of the subdetectors are applied to an electronic processing circuit EP in which these signals together with the signals from the detector $D_2$ of the second imaging system are processed into control signals for the drive means DV for the substrate table WT'.

Instead of a Savart plate S it is also possible to use a Wollaston prism. As is shown in the left-hand part of FIG. 3 such a prism comprises two congruent prisms $WP_{1,a}$ and $WP_{1,b}$ of uniaxial birefringent crystals which have been combined to form a plane-parallel plate. The optic axes $OA_1$ and $OA_2$ extend parallel and perpendicularly, respectively to the plane of drawing. A beam which is incident on one of the plane-parallel surfaces of the prism $WP_1$ and which has a direction of polarization which is disposed at an angle of 45° relative to the optic axes of the prism is split into two sub-beams by the prism, which sub-beams are polarized perpendicularly relative to each other and make a small angle with one another. By a suitable choice of the parameters, thickness and refractive indices, of the prism $WP_1$ it is possible to ensure that at the location of the grating the sub-beams are shifted relative to each other over a distance which is equal to half the grating period and each have the correct phase.

Preferably, the Wollaston prism is arranged in the first focal plane of the lens $IL_1$. After passage through this lens the two mutually perpendicularly polarized sub-beams extend parallel to each other. Moreover, it is then assured that the direct beams and the beams which are reflected by the substrate traverse the prism at the same angles. If the Wollaston prism is arranged outside the focal plane the beams will not be incident on the substrate parallel to each other, so that the distance between this substrate and the Wollaston prism becomes critical. Moreover, the reflected beams will then traverse this prism in a different way from the incident beams, so that the image of the phase grating formed on the detector will be less rich in contrast.

By means of a realized version of the pre-alignment system described in the foregoing a substrate can be pre-aligned with an accuracy of $\pm 5$ $\mu$m. The alignment range of this pre-alignment system is $\pm 300$ $\mu$m. A substrate which has been transferred to the pre-alignment station by mechanical transfer means can be positioned on the substrate table WT' by mechanical stops within said range.

Apart from polarization-sensitive elements, such as a Savart plate or a Wollaston prism, it is possible to employ other elements, such as a combination of semitransparent and fully reflecting mirrors, for splitting the beam $b_1$. The beam reflector PBS may then be a polarization-neutral beam reflector. Alternatively, the phase gratings may have grating periods which differ from those specified above. For the invention it is essential only that the distance between the sub-beams is equal to half the grating period.

The illumination system comprises a lamp $LA_1$ and a condenser lens $CL_1$ which forms a beam of the radiation emitted by the lamp and focuses this lamp in the pupil of the lens $IL_1$, so that a maximum amount of light is available for pre-alignment. Just behind the condenser lens an aperture $DP_1$ is arranged which is focused on the phase grating. This ensures that only an area slightly larger than the phase grating is illuminated. This method of illumination also ensures that hardly any stray light can reach the phase grating and that the detector signals contain hardly any noise.

The Savart plate or the Wollaston prism splits the pre-alignment beam into two sub-beams which are mutually coherent and which after passage through the beam reflector $PBS_1$ can interfere with each other owing to this coherence. The sub-beams themselves and the pre-alignment beams themselves, however, need not be coherent. Therefore, it is not necessary to employ a laser, which is monochromatic.

When a lamp $LA_1$ is used, such as an incandescent lamp, which emits a broad radiation spectrum a special beam reflector prism $PBS_1$ must be used. A conventional polarization-sensitive reflecting prism has been designed for the components of a beam whose wavelengths are situated within a narrow band. The beam-reflecting layer of such a prism may comprise a plurality of sub-layers having thicknesses of the order of a quarter of half the reference wavelength. In accordance with the invention the prism PBS, which is employed in the pre-alignment system with broad-spectrum illumination has a beam-reflecting layer which comprises a first and a second set of sub-layers, the first set acting as a beam reflector in a first wavelength range around a first reference wavelength and the second set acting as a beam reflector in a second wavelength range around a second reference wavelength. The entire layer comprising the two sets of sub-layers can then reflect a beam with a broad range of wavelengths covering two reference wavelengths.

For the Savart plate or the Wollaston prism it is not necessary to take special steps in view of the broad spectrum of the pre-alignment beam because these elements are substantially wavelength-independent, in particular if the radiation of this beam is situated in the near infrared range, which is preferred for the pre-alignment system.

So far, only the first imaging system, the left-hand system in FIG. 1, has been described. As will be apparent from FIG. 3, the second, right-hand imaging system is identical to the first one, so that the second system will not be described.

The signals from the composite detector of the second imaging system are applied to the electronic processing circuit EP in order to be processed, together with the signals from the detector $D_1$, into control signals for the drive means DV. As is indicated in the lower part of FIG. 3 the substrate table WT' is moved by means of three separately controlled drives $DV_1$, $DV_2$ and $DV_3$. The drive $DV_1$ moves the table in the X-direction and the two drives $DV_2$ and $DV_3$ provide the movements in the Y-direction. Owing to the separate control of $DV_2$ and $DV_3$ by means of the signals $S_{y1}$ and $S_{y2}$ the substrate table cannot only perform linear movements in the X and Y-directions, but can also rotate about a point, for example point R, thereby enabling angular alignment.

As is shown in FIG. 3 both illumination systems may comprise a beam separator $BS_1$ or $BS_2$. These beam separators reflect a small portion, for example a few per cent, of the beams $b_1$ and $b_2$ via a reflecting prism $RP_1$ to a reference mark, such as cross-hairs GR. The position of the gratings $P_1$ and $P_2$ relative to the cross-hairs can be visualized for the operator by means of a lens $IL_3$ and a reflecting prism $RP_2$, which image the cross-hairs and the superimposed images of the grating on a television camera TVC which is coupled to a monitor MON.

The invention has been described for the projection of an IC pattern on a semiconductor substrate. It is obvious that the apparatus described above may also be employed in other lithographic techniques where consecutively a plurality of masks have to be projected on a substrate and must be aligned very accurately relative to the substrate. An example of this is the manufacture of propagation patterns and detection patterns for magnetic domain memories. In the above description "IC pattern" should be read "propagation pattern" or "detection pattern" and "substrate" should read "layer of a magnetizable material".

What is claimed is:

1. Apparatus for imaging a mask pattern on a substrate, which apparatus comprises a projection column provided with an optical imaging system and an optical fine-alignment system for aligning two alignment marks which extend on the substrate relative to associated alignment marks in the mask, which apparatus further comprises a pre-alignment station for pre-aligning the substrate, and transfer means for transferring the substrate to a position beneath the projection column without disturbing the pre-alignment, wherein said pre-alignment station comprises two radiation-sensitive detection systems and two optical imaging systems for imaging the two alignment marks on the substrate onto said two radiation-sensitive detection systems, each of said radiation-sensitive detection systems including an even number of at least two detectors arranged beside each other in a direction associated with a direction in which an associated substrate mark is to be aligned, each said detector producing output signals, the difference in output signals of said at least two detectors of each said detection system being indicative of the alignment of the associated substrate mark in the associated direction relative to the associated detection system, said apparatus including drive means responsive to said output signals for controlling the position of a substrate relative to said detectors.

2. Apparatus as claimed in claim 1, intended for a substrate whose alignment marks are phase gratings, wherein the two detection systems in the pre-alignment station are constituted by microscopes which image the phase gratings on the detectors as amplitude structures.

3. Apparatus as claimed in claim 2, wherein the microscopes are interference microscopes which each comprises an illumination system, an imaging lens for the formation of a radiation spot on a phase grating and for imaging this grating onto a detector and a beam-splitting element for splitting the radiation from the illumination system into two sub-beams in such a way that at the location of the phase grating the sub-beams are shifted relative to each other over a distance equal to half the grating period of the phase grating and for combining the two sub-beams which have been reflected by the phase grating.

4. Apparatus as claimed in claim 3, wherein each beam-splitting element is a polarization-sensitive beam splitter and wherein a polarization-sensitive beam reflector is arranged between each illumination system and each imaging lens for directing radiation of a specific direction of polarization towards an associated phase grating and for transmitting the radiation which has been reflected by the associated phase grating to the associated detection system.

5. Apparatus as claimed in claim 4, wherein each polarization-sensitive beam splitter is a Savart plate.

6. Apparatus as claimed in claim 4, wherein each the polarization-sensitive beam splitter is a Wollaston prism.

7. Apparatus as claimed in claim 4, wherein each beam reflector comprises a polarization-snesitive beam-reflecting layer which comprises two sub-layers which operate in two adjacent wavelength ranges.

8. Apparatus as claimed in any one of claims 3 through 7, wherein each imaging lens has a pupil, each illumination system comprises a radiation source followed by a condenser lens which images the radiation source in the pupil of the imaging lens and wherein a field aperture is arranged behind each condenser lens, each of which apertures is imaged on an associated phase grating.

9. Apparatus as claimed in any one of claims 1 through 7, wherein a beam separator having a low reflection coefficient is arranged in front of each detection system in order to reflect a small portion of the radiation which has been reflected by an associated phase grating to a reference mark, and wherein there are provided optical means for visually observing the reference mark and the image of the phase grating superimposed on said mark.

* * * * *